United States Patent [19]

Kato

[11] Patent Number: 5,229,309
[45] Date of Patent: Jul. 20, 1993

[54] METHOD OF MANUFACTURING SEMICONDUCTOR DEVICE USING A FERROELECTRIC FILM OVER A SOURCE REGION

[75] Inventor: Koji Kato, Suwa, Japan

[73] Assignee: Ramtron International Corporation, Colorado Springs, Colo.

[21] Appl. No.: 828,886

[22] PCT Filed: May 31, 1991

[86] PCT No.: PCT/JP91/00735

§ 371 Date: Feb. 24, 1992

§ 102(e) Date: Feb. 24, 1992

[87] PCT Pub. No.: WO91/19321

PCT Pub. Date: Dec. 12, 1991

[30] Foreign Application Priority Data

Jun. 1, 1990 [JP] Japan .................. 2-143563

[51] Int. Cl.⁵ .................. H01L 21/76; H01L 29/788
[52] U.S. Cl. .................. 437/43; 437/60; 437/978; 257/295; 257/324
[58] Field of Search .................. 437/43, 52, 60, 919, 437/978, 193, 195; 365/117, 145; 357/23.5, 71; 148/DIG. 14, DIG. 43; 29/25.42; 257/295, 324

[56] References Cited

U.S. PATENT DOCUMENTS

| | | | |
|---|---|---|---|
| 4,149,302 | 4/1979 | Cook | 257/506 |
| 4,437,139 | 3/1984 | Howard | 437/978 |
| 4,888,630 | 12/1989 | Paterson | 357/23.5 |
| 5,024,964 | 6/1991 | Rohrer et al. | 437/49 |
| 5,046,043 | 9/1991 | Miller et al. | 365/145 |

FOREIGN PATENT DOCUMENTS 0338157 10/1989 European Pat. Off. .

*Primary Examiner*—Brian E. Hearn
*Assistant Examiner*—C. Chaudhari
*Attorney, Agent, or Firm*—Edward D. Manzo; Mark J. Murphy

[57] ABSTRACT

A method for manufacturing a memory integrating a ferroelectric film, having properties such as excellent information rewriting times, breakdown voltage and leak current and the like, by forming a lower electrode sandwiching a ferroelectric material on a high concentration diffusion layer, such as source and drain regions, formed on a semiconductor substrate, and forming a polysilicon film between the electrode and the high concentration diffusion layer. A semiconductor device formed by the method of the present invention is also disclosed.

7 Claims, 2 Drawing Sheets

PRIOR ART

METHOD OF MANUFACTURING SEMICONDUCTOR DEVICE USING A FERROELECTRIC FILM OVER A SOURCE REGION

FIELD OF THE INVENTION

The present invention relates to a method of manufacturing a memory, and in particular, to an electrically rewritable non-volatile memory having a ferroelectric material as capacitor dielectric.

BACKGROUND OF THE INVENTION

In a conventional semiconductor non-volatile memory, use is commonly made of an MIS-type transistor having a phenomenon that the surface potential of a silicon substrate is modulated by injecting a load from the silicon substrate into a trap in an insulating gate or a floating gate. The MIS-type transistor is used similarly in an EPROM (ultraviolet ray erasable non-volatile memory), EEPROM (electrically rewritable non-volatile memory), and the like.

However, such non-volatile memories have disadvantages such as a high information rewriting voltage, typically between 12 and 20 volts, and very long rewriting time (for example, several ten msec in the case of an EEPROM). Moreover, the information rewriting number is limited to 100 to 10,000 times which is a problem when the memory is used repeatedly. In a non-volatile memory having a ferroelectric material which can electrically inverse polarization, write-in time and read-out time are substantially the same in principle, and polarization is maintained even if power is cut off, so that this non-volatile memory has an ideal.

With respect to a non-volatile memory having a ferroelectric material, U.S. Pat. No. 4,149,302 discloses a structure integrating a capacitor consisting of a ferroelectric material on a silicon substrate, and U.S. Pat. No. 3,832,700 discloses a non-volatile memory wherein a ferroelectric film is on the gate portion of a MIS-type transistor.

Moreover, in IEDM '87, pp. 850–851, a non-volatile memory having a structure laminated in a MOS-type semiconductor device such as shown in FIG. 2 was disclosed. In FIG. 2, a P-type Si substrate 201, an element separating LOCOS oxide film 202, an N-type diffusion layer 203, such as a source region, and an N-type diffusion layer 204, such as a drain region, are shown. A gate electrode 205, and an interlayer insulating film 206 are also shown. A ferroelectric film 207 when sandwiched between a lower electrode 208 and an upper electrode 209 results in the formation of a capacitor. A second interlayer insulating film has reference numeral 210 and a wiring electrode 211 is comprised of Al. Such structure of laminating on the upper portion of an MOS-type semiconductor device should distribute wires between the electrode of a ferroelectric film and the high concentration diffusion layer, such as source and drain regions on the semiconductor substrate with the use of Al or other conventional interconnect materials.

One problem with the prior art, as shown in FIG. 2 of the present application, is the large amount of area occupied by the transistor and ferroelectric capacitor regions.

Therefore, the object of the present invention is to solve this problem and aims to provide a semiconductor device, particularly a non-volatile memory, having a small memory cell area even with the use of a ferroelectric film, and has a low cost, and fast information rewriting times.

SUMMARY OF THE INVENTION

The present invention relates to a method for manufacturing a semiconductor device integrating a ferroelectric film via electrodes by sandwiching the ferroelectric film on the same semiconductor substrate as that where an active element is formed. The method comprises the steps of forming a polysilicon film between a lower electrode and a high concentration diffusion layer and sandwiching a ferroelectric film between the top and bottom electrodes, forming the lower electrode on said polysilicon film, etching said lower electrode and a part of said polysilicon film using etching which has a low selection ratio, and etching the remaining polysilicon film using etching which has a high selection ratio with silicon oxide.

BRIEF DESCRIPTION OF THE DRAWINGS

In describing the preferred embodiment, reference is made to the accompanying drawings wherein.

DETAILED DESCRIPTION OF THE PRESENTLY PREFERRED EMBODIMENT

Figure 1A:
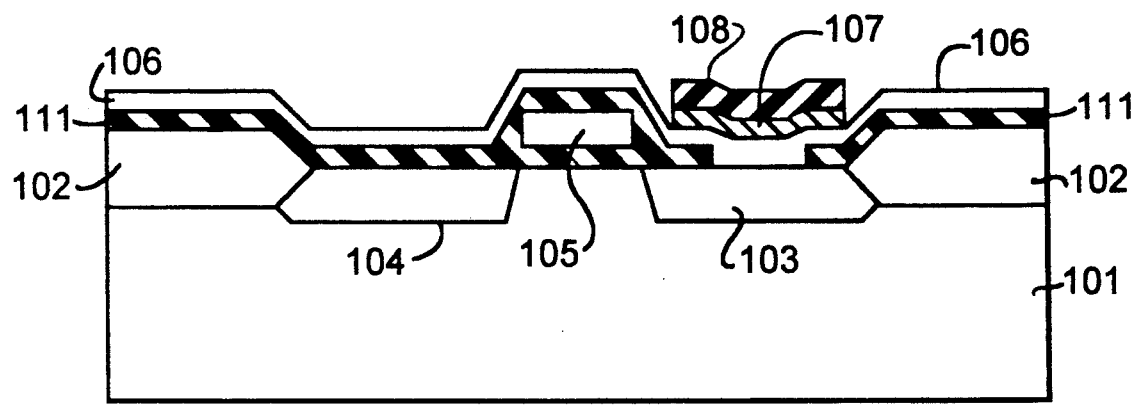
FIGS. 1(a)–(c) are cross-sectional views showing the main steps of one of the preferred embodiments of the method for manufacturing a semiconductor device according to the present invention.
Figure 1B:
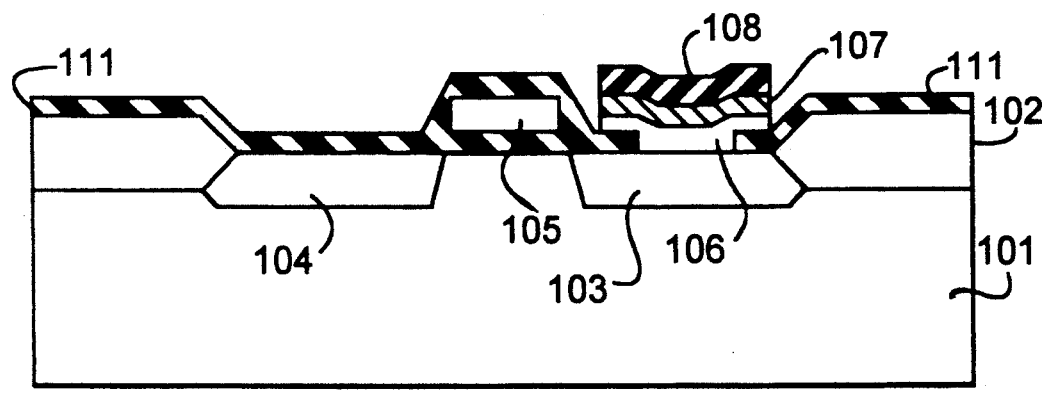
Figure 1C:
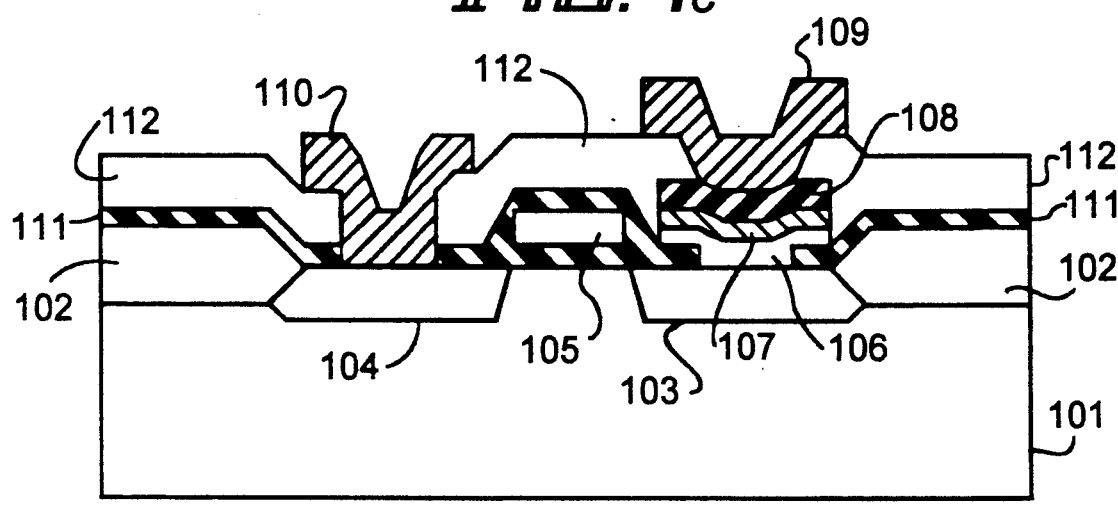
Figure 2:
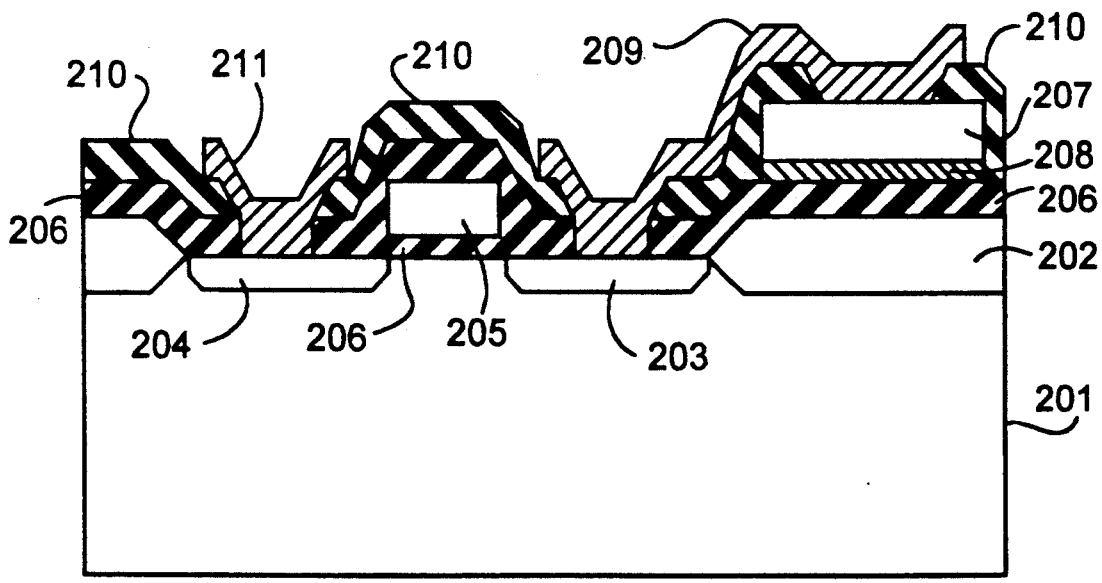
FIG. 2 is a cross-sectional view of a non-volatile memory according to the prior art.

FIGS. 1(a)–(c) are cross-sectional views showing the main steps of one embodiment of the method for manufacturing a semiconductor device according to the invention. The method for manufacturing the semiconductor device according to the invention is explained by reference to FIG. 1. For the sake of explanation, an embodiment having a Si substrate and an N-channel transistor is illustrated.

FIG. 1(a) shows a P-type Si substrate 101 and uses a wafer of specific resistance such as 20 ohm-cm. An element separating insulating film 102 and an oxide film with a thickness of 6000 Å is formed by a LOCOS method by a known technique. An N-type diffusion layer 103, such as a source region, is formed by ion injection of phosphorus at 80 KeV $5 \times 10^{15}$ cm$^{-2}$. Another N-type diffusion layer 104, such as a drain region, is formed simultaneously with layer 103. A gate electrode 105 using phosphorus-doped polysilicon, an interlayer insulating film 111 comprised of 4000 Å of phosphor deposition (CVD)$_3$ and a contact hole are formed by conventional photolithography and etch techniques. A polysilicon film 106 is formed with a thickness of 5000 Å, by a chemical vapor phase growing method. In this case, the film thickness of the polysilicon film is preferably at least the same as that of first interlayer insulating film 111. An electrode 107 for a ferroelectric film 108 is formed by sputtering Pt, Pd or the like. Ferroelectric film 108 comprises PbTiO$_3$, PZT (mixed crystalline PbTiO$_3$ and PbZrO$_3$), PLZT (La-doped PZT) and the like, and is formed by a sputtering method or the like.

Next, after a resist is formed by an exposure technique, ferroelectric film 108 and another electrode 107 are simultaneously etched by a sputter etching. In this case, a part of the polysilicon film 106 may be etched simultaneously. (See FIG. 1(a)).

Then, the remaining polysilicon film 106 is removed by reactive ion etching. (See FIG. 1(b)).

The top electrode 109 for the ferroelectric film and the interconnect layer 110 (to drain region 104) are formed at the same time and comprise Al. A second interlayer insulating film 112 of phosphorus glass having a thickness of 4000 Å is formed by a chemically vapor phase growing method. (see FIG. 1(c)).

According to the steps shown in FIG. 1, the ferroelectric film is directly formed over the high concentration diffusion region 103, and the lower electrode is directly in contact with the high concentration diffusion layer via the polysilicon film, so that the wiring is only needed for the upper electrode, and high integration with a small element area is possible.

If no polysilicon film were to be used in the structure of FIG. 1, the thickness of ferroelectric film would not be uniform due to the step difference of the contact hole, and as a result, the ferroelectric capacitor characteristics would be degraded, reducing the number of read/write cycles to less than $10^5$ times. Further, the breakdown voltage would be reduced to 12 V. On the other hand, when a polysilicon film 106 is located between an electrode 107 and a high concentration diffusion layer by a chemical vapor growing method, since polysilicon has good adhesitivity, the step difference of the contact hole is mitigated, and the film thickness of the ferroelectric film is more uniform improving read/write cycles to $10^{10}$ times, and improving the breakdown voltage to 30 V.

A non-volatile memory is mainly explained above, but the invention can be applied to a memory (DRAM and the like) with the aid of a large specific dielectric constant of the ferroelectric as a matter of course.

Thus, it will be understood that the preferred embodiment method comprises the steps of forming a polysilicon film between a lower electrode and a high concentration diffusion layer by a chemical vapor phase growing method, simultaneously etching said electrode and a part of said polysilicon film with the use of sputter etching, and removing the remaining polysilicon film by reactive ion etching, so that the step difference of a contact hole is mitigated, and a film thickness of the ferroelectric film is uniformly formed, and thereby integrating the ferroelectric film without increasing the element area, but nevertheless achieving excellent electrical characteristics.

I claim:

1. A method for forming a semiconductor device comprising the steps of:

forming a source region and a drain region located in a substrate with a gate electrode over said substrate and between said source region and said drain region;

establishing an insulating layer over said substrate and around said gate electrode;

establishing a contact hole in said insulating layer to said source region;

establishing a polysilicon film located directly over and in direct contact with the source region in said contact hole, the polysilicon film also being located over said insulating layer;

establishing a lower electrode over said polysilicon film;

establishing a ferroelectric film over said lower electrode;

etching said lower electrode and said ferroelectric film;

etching said polysilicon film so that said polysilicon film is in said contact hole and over a portion of said insulating layer; and establishing an upper electrode over said ferroelectric film.

2. The method of claim 1 wherein said polysilicon film is established by chemically vapor growing said film and has a thickness at least equal to the thickness of the insulating layer.

3. The method of claim 1 further comprising the steps of establishing a second insulating layer over said insulating layer and defining a wiring electrode in said second insulating layer to said drain region.

4. A semiconductor device comprising:

a substrate with a source region and a drain region located therein;

a gate electrode located over said substrate and between said source region and said drain region;

an insulating layer located over said substrate and around said gate electrode;

a polysilicon film located in a contact hole in said insulating layer and located directly over and in direct contact with said source region and located over a portion of said insulating layer;

a lower electrode located over said polysilicon film;

a ferroelectric film located over said lower electrode; and an upper electrode located over said ferroelectric film.

5. The device of claim 4 wherein said lower electrode is comprised of a element from the group comprises of platinum and palladium.

6. The device of claim 4 wherein said ferroelectric film is comprised of PZT.

7. The device of claim 4 wherein said upper electrode is comprised of aluminum.

* * * * *